United States Patent
How et al.

(10) Patent No.: US 6,225,144 B1
(45) Date of Patent: May 1, 2001

(54) METHOD AND MACHINE FOR UNDERFILLING AN ASSEMBLY TO FORM A SEMICONDUCTOR PACKAGE

(75) Inventors: James Boon Hua How; Han Yang Chua; Peter Zhihua Yuan; Nee Seng Ling, all of Singapore (SG)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/487,042

(22) Filed: Jan. 19, 2000

(30) Foreign Application Priority Data

Mar. 1, 1999 (SG) ................................... 9900920

(51) Int. Cl.[7] ........................... H01L 21/44; H01L 21/48; H01L 21/50
(52) U.S. Cl. ........................... 438/106; 438/126; 438/127
(58) Field of Search .................... 438/106, 126, 438/127

(56) References Cited
U.S. PATENT DOCUMENTS 5,784,261 * 7/1998 Pedder .
5,930,598 * 7/1999 Wille et al. .
6,015,722 * 7/1999 Banks et al. .
6,046,076 * 4/2000 Mitchell et al. .

* cited by examiner

Primary Examiner—John F. Niebling
Assistant Examiner—Josetta I. Jones
(74) Attorney, Agent, or Firm—Philip P. Macnak

(57) ABSTRACT

A method and machine (1) for underfilling an assembly (8) to form semiconductor package is disclosed. The machine (1) has conveying tracks (2) for continuously conveying the assembly (8) past zones. The assembly (8) has a flexible tape substrate (9) with a mounted inverted semiconductor die (10). The machine includes a preheating zone (3), a dispensing zone (4) for dispensing an underfill material onto the substrate (9) whilst heating the assembly (8) to allow the underfill to flow into a gap between the substrate (9) and semiconductor die (10). The machine (1) also has a postheating zone (5) for postheating the assembly (8) after dispensing to provide for a continuous flow of the underfill into the gap.

5 Claims, 3 Drawing Sheets

METHOD AND MACHINE FOR UNDERFILLING AN ASSEMBLY TO FORM A SEMICONDUCTOR PACKAGE

FIELD OF THE INVENTION

This invention relates to a method and machine for underfilling an assembly to form semiconductor package. The invention is particularly useful for, but not necessarily limited to, flip chip semiconductor packages having an inverted die mounted to a substrate.

BACKGROUND ART

Ever increasing requirements for reducing the size of packaged semiconductor devices has led to the development of several different types of semiconductor packages. Generally speaking, reduced sizes of semiconductor devices use an inverted die that is directly attached to a substrate to thereby increase the density of external connections that are provided within the perimeter of the package.

One such package is known as a flip chip semiconductor package and sometimes comprises a flexible tape substrate with a pattern of runners with corresponding outer portions that are made available for interconnection to, for example, a printed circuit board. An inverted die is mounted to the substrate and the runners are soldered to pads on the die. With this package a relatively high density of runners can be formed on the flexible substrate to provide a higher density of external connections. The flip chip semiconductor package with a flexible tape substrate is becoming a popular alternative to the conventional more rigid substrate packages. Currently, flip chip semiconductor packages are manufactured such that after the die is mounted to the flexible substrate to form an assembly. The assembly is preheated then an underfill material is dispensed onto the assembly in a heated dispensing zone. The underfill then starts to flow into a gap between the substrate and die. The assembly remains stationary in the dispensing zone to allow the underfill to be drawn into the gap by the effects of capillary action. The assembly is then conveyed to a cooling zone heat is removed from the assembly and the underfill material at least partially solidifies. The assembly is later reheated to cure the underfill and form the completed semiconductor package. However, in order to increase production rates, the assembly may be prematurely removed from the heated dispensing zone and the underfill may not have been completely drawn into the gap by the effects of capillary action. Alternatively, if the assembly is kept stationary in the heated dispensing zone until the underfill have been completely drawn into the gap, then this unnecessarily increases the time to manufacture underfilled semiconductor packages.

SUMMARY OF THE INVENTION

It is an object of the present invention to overcome or alleviate at least one of the problems associated with prior art underfilling of assemblies to form semiconductor packages.

According to one aspect of the invention there is provided a method for underfilling an assembly to form a semiconductor package, the method including the steps of:

preheating an assembly including a substrate with at least one semiconductor die mounted thereto;

dispensing an underfill material onto the substrate whilst heating the assembly, said heating providing for said underfill to flow into a gap between said substrate and said semiconductor die; and postheating the assembly immediately after said dispensing to provide for a continuous flow of said underfill into said gap, wherein during said step of postheating said assembly continuously moves along a conveyor.

Suitably, said step of postheating may be for a duration of at (east thirty seconds after the step of dispensing.

Preferably, the method may further include the steps of:

cooling said underfill; and subsequent curing of said underfill.

Preferably, said method may be further characterised by said substrate being a flexible tape.

Suitably, said method may be further characterised by said assembly continuously moving during the steps of preheating, dispensing and postheating.

Preferably, said method may be further characterised by said assembly continuously moving during the steps of cooling and subsequent curing.

According to another aspect of the invention there is provided a machine for underfilling an assembly to form a semiconductor package, said machine including:

a conveyor for continuously conveying an assembly past at least some zones of said machine, said assembly including a substrate with at least one semiconductor die mounted thereto;

a preheating zone;

a dispensing zone for dispensing an underfill material onto the substrate whilst heating the assembly, said heating providing for said underfill to flow into a gap between said substrate and said semiconductor die; and a postheating zone for postheating the assembly immediately after said dispensing to provide for a continuous flow of said underfill into said gap.

Suitably, said postheating zone and conveyor may provide for a postheating duration of at least thirty seconds after the step of dispensing, said postheating being at substantially the same temperature as that of said dispensing zone.

Preferably, the machine may be coupled by said conveyor to a cooling zone and subsequent curing zone for curing of said underfill material.

BRIEF DESCRIPTION OF THE DRAWINGS

In order that the present invention may be readily understood and put into practical effect, reference will now be made to a preferred embodiment illustrated in the accompanying drawings in which.

DETAILED DESCRIPTION OF THE PREFERRED EMBODIMENT OF THE INVENTION

Figure 1:
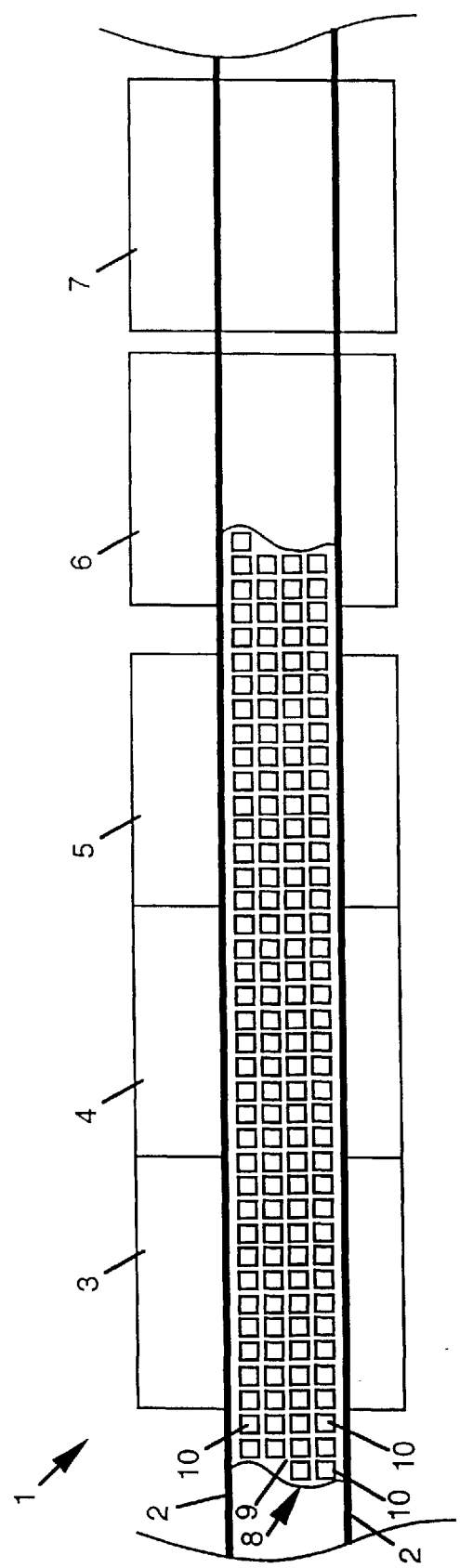
FIG. 1. is a schematic diagram of a machine for underfilling a semiconductor package.

Referring to FIG. 1 there is illustrated a machine 1 for underfilling an assembly to form a semiconductor package.

The machine 1 includes a conveyor, comprising two parallel conveying tracks 2, a preheating zone 3, a dispensing zone 4 and a postheating zone 5. The machine 1 is coupled by conveying tracks 2 to a cooling zone 6 and subsequent curing zone 7. The conveying tracks 2 provide for conveying semiconductor assemblies 8 past zones 3 to 7, these assemblies are formed from a flexible tape substrate 9 having inverted semiconductor dies 10 mounted thereon and are illustrated in more detail in FIGS. 3 to 5.

Figure 2:
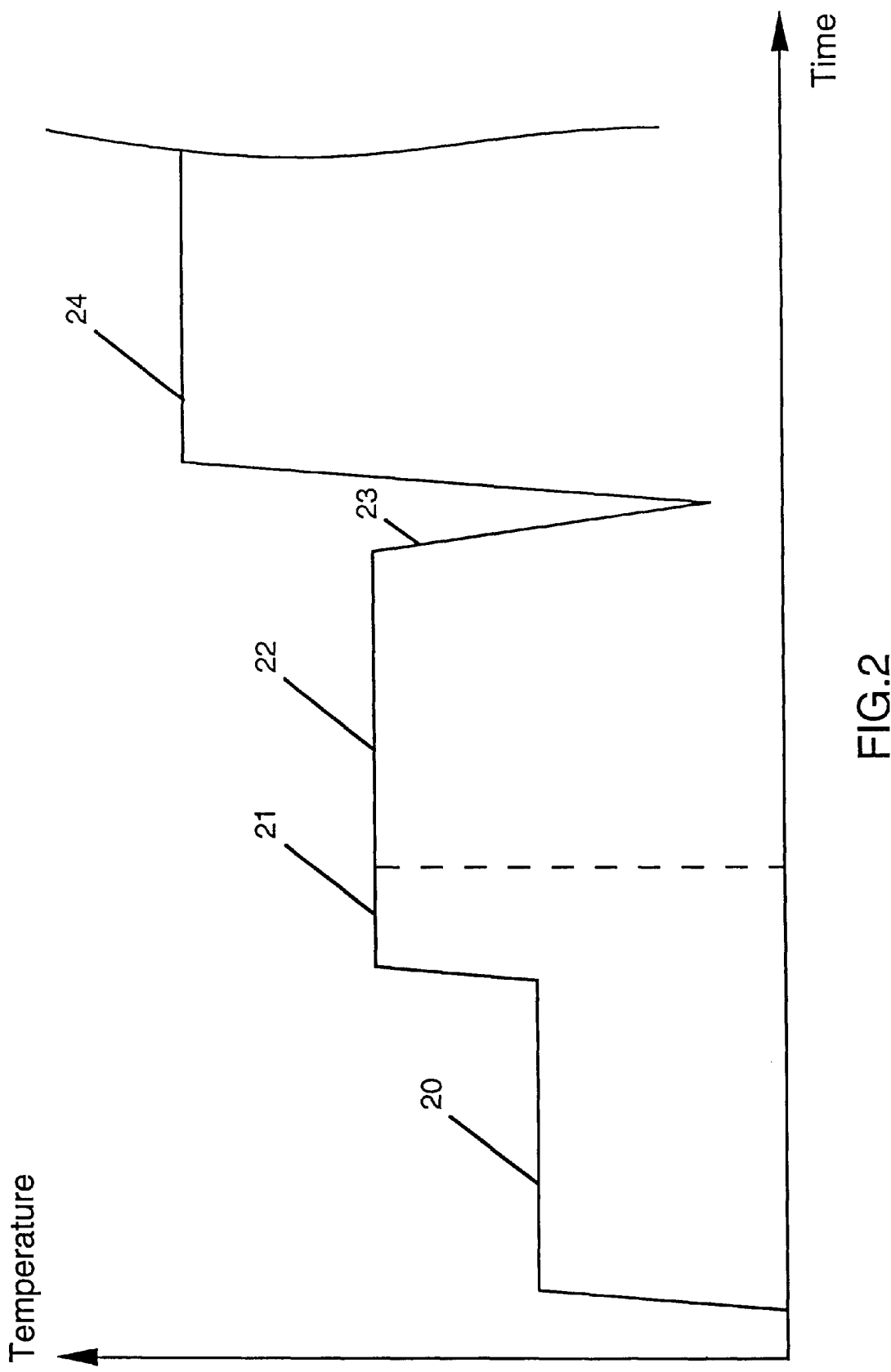
FIG. 2. illustrates a method of temperature control steps for underfilling an assembly to form a semiconductor package using the machine of FIG. 1.

Referring to FIG. 2 there is illustrated a method of temperature control steps for underfilling each of the assemblies 8 to form a semiconductor package 19 using machine 1. As illustrated, when the assemblies 8 are conveyed by conveyor tracks 2 through each of zones 3 to 7, preheating step 20 at preheating zone 3 preheats the assemblies to a temperature of typically 70 degrees Centigrade +/−10 degrees Centigrade. A dispensing step 21 at dispensing zone 4 then dispenses an underfill material onto the tape substrate 9 at edges of each of the dies 10. In dispensing zone 4, the assemblies 8 are typically heated to 80 degrees Centigrade +/−10 degrees Centigrade. A postheating step 22 is effected at postheating zone 5 where the assemblies 8 are postheated immediately after the dispensing step 21, for approximately 30 to 60 seconds, typically at the same temperature as that applied at the dispensing step 21. A cooling step 23 of the assemblies 8 is effected in cooling zone 6 and in zone 7 a curing step 24 is effected so that the assemblies 8 are heated to typically 150 degrees Centigrade.

Figures 3, 4, 5:
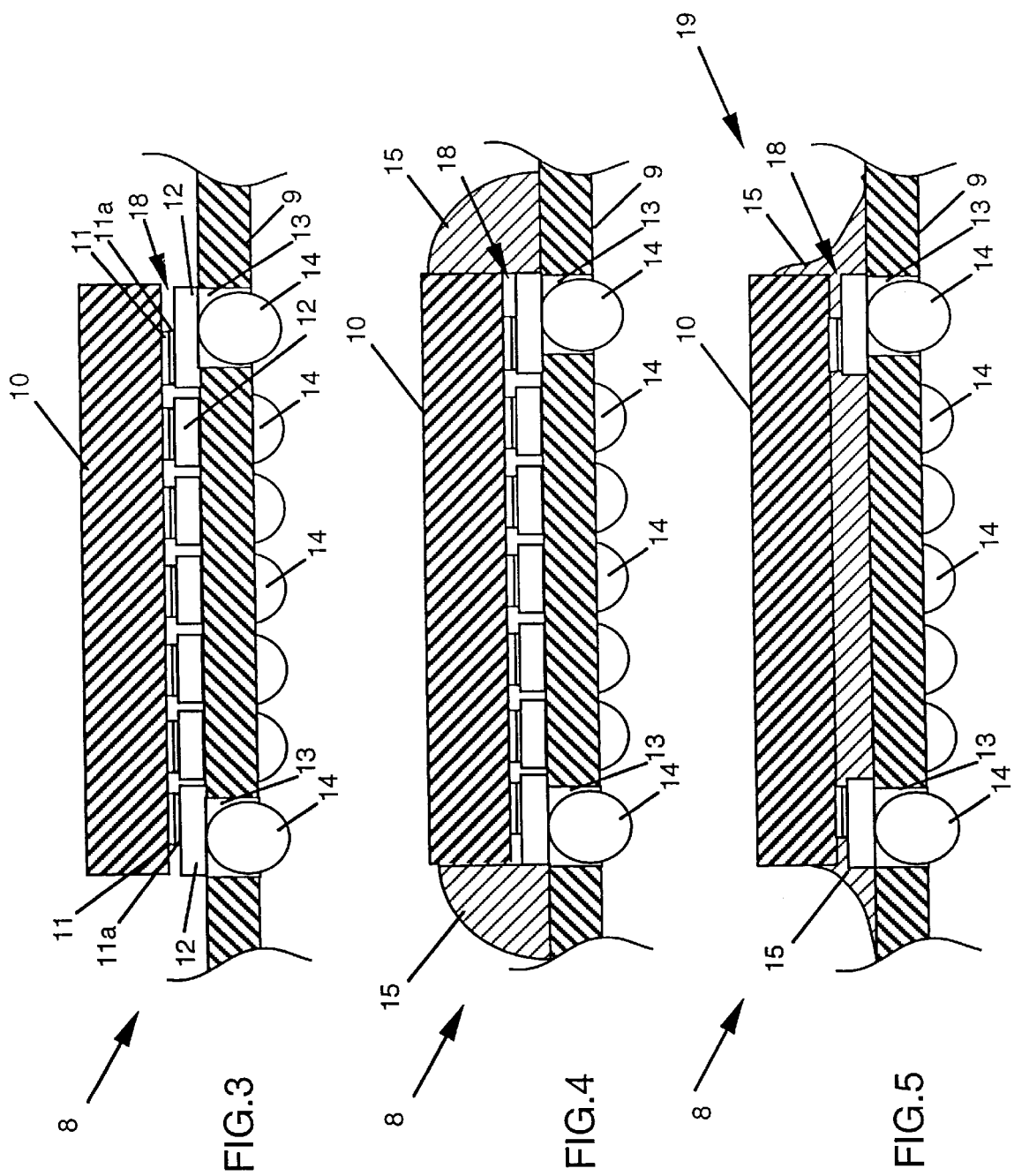
FIG. 3 illustrates cross section of an assembly, to be underfilled to form a semiconductor package, during a preheating step of FIG. 2.
FIG. 4 illustrates cross section of an assembly, to be underfilled to form a semiconductor package, during a dispensing step of FIG. 2.
FIG. 5 illustrates cross section of an assembly, to be underfilled to form a semiconductor package, during a postheating step of FIG. 2.

Referring to FIG. 3 it is clearly shown that in addition to substrate 9 and inverted semiconductor dies 10, each of the assemblies 8 further comprises die pads 11 in a gap 18 between substrate 9 and the respective one of the dies 10. These die pads 11 are arranged in a predetermined pattern to provide inputs and outputs to circuitry of the associated one of the dies 10. Typically, the pads 11 and the circuitry are usually formed on a common surface of the associated one of the dies 10 and each of the pads 11 is formed by a layer of metallization, usually aluminium.

As will be apparent to a person skilled in the art, an additional layer of metallization 12 is formed on the pads 11. The layer of metallization 11a comprises a layer of gold on the pads 11. The additional layer of metallization 11a is formed on the pads 11 by mechanical gold stud bumping and has a thickness of approximately 15 to 25 micrometers.

The flexible substrate 9 has a pattern of interconnecting runners 12 and are typically made of copper, these runners are electrically connected to respective pads 11 by allowing for thermocompression bonding which is made possible by additional layer of metallization 11a. The flexible substrate 9 is typically made of polymide which is an electrically insulator and an end of each of the interconnecting runners 12 forms bond locations which are arranged to correspond with the pattern of the pads 11.

A pattern of apertures 13 in the flexible substrate 9 provide access to portions of interconnecting runners 12.

Solder balls 14 are electrically attached through apertures 13 of associated interconnecting runners 12 to form what is known as a ball grid array used to mount as well as to couple the assembly 8 to connection points on a printed circuit board as will be apparent to a person skilled in the art.

The solder balls 14 are placed in the apertures 13 by flux ball placement and are attached to the interconnecting runners 12 by a reflow process.

After the assemblies 8 as have been preheated in preheating zone 3, they move along conveyor tracks 2 to dispensing zone 4 where an underfill 15 is dispensed onto the substrate 8 at two edges of each of the dies as illustrated in FIG. 4. During dispensing the assemblies 8 are heated to typically 80 degrees Centigrade and this temperature is maintained during postheating in postheating zone 5. Accordingly, the assemblies 8 are kept at approximately at 80 degrees centigrade to allow for continuous flow of said underfill during both dispensing and postheating so that capillary action assists the underfill 15 into being drawn into gap 18 as illustrated in FIG. 5. The assemblies 8 are then cooled in cooling zone 6 and subsequently cured at a temperature of typically 150 degrees Centigrade in curing zone 7 to form semiconductor package 19. Advantageously, the present invention reduces the time to manufacture underfilled semiconductor packages due to unnecessary long delays in the dispensing zone. The present invention may also reduce the possibility of voids.

Although the invention has been described with reference to a preferred embodiment it is to be understood that the invention is not restricted to the embodiment described herein.

We claim:

1. A method for underfilling an assembly to form a semiconductor package, the method including the steps of:

preheating an assembly including a substrate with at least one semiconductor die mounted thereto;

dispensing an underfill material onto the substrate whilst heating the assembly, said heating providing for said underfill to flow into a gap between said substrate and said semiconductor die; and postheating the assembly immediately after said dispensing to provide for a continuous flow of said underfill into said gap, wherein during said step of postheating said assembly continuously moves along a conveyor.

2. A method for underfilling an assembly as claimed in claim 1, wherein said step of postheating is for a duration of at least thirty seconds after the step of dispensing.

3. A method for underfilling an assembly as claimed in claim 2, wherein the method further includes the steps of:

cooling said underfill; and subsequent curing of said underfill.

4. A method for underfilling an assembly as claimed in claim 1, wherein said method is further characterised by said assembly continuously moving during the steps of preheating, dispensing and postheating.

5. A method for underfilling an assembly as claimed in claim 4, wherein, said method is further characterised by said assembly continuously moving during the steps of cooling and subsequent curing.

* * * * *